United States Patent [19]
Gruenenfelder et al.

[11] Patent Number: 5,997,697
[45] Date of Patent: Dec. 7, 1999

[54] MAGNETRON SPUTTERING SOURCE AND METHOD OF USE THEREOF

[75] Inventors: Pius Gruenenfelder, Wangs; Hans Hirscher, Bad Ragaz; Walter Haag, Grabs; Walter Albertin, Bad Ragz, all of Switzerland

[73] Assignee: Balzers Aktiengesellschaft, Liechtenstein

[21] Appl. No.: 08/726,419

[22] Filed: Oct. 7, 1996

[51] Int. Cl.$^6$ ..................................................... C23C 14/34
[52] U.S. Cl. .............................. 204/192.12; 204/298.18; 204/298.19
[58] Field of Search ................... 204/192.12, 298.18, 204/298.19

[56] References Cited

U.S. PATENT DOCUMENTS

| | | |
|---|---|---|
| 5,164,063 | 11/1992 | Brauer et al. . |
| 5,688,381 | 11/1997 | Gruenenfelder et al. ...... 204/298.18 X |

FOREIGN PATENT DOCUMENTS

| | | |
|---|---|---|
| 0 095 211 | 11/1983 | European Pat. Off. . |
| 0 558 787 | 9/1993 | European Pat. Off. . |
| 42 02 349 A1 | 8/1993 | Germany . |
| 3-797690 | 4/1991 | Japan . |

OTHER PUBLICATIONS

International Search Report dated Jun. 20, 1996.

*Primary Examiner*—Nam Nguyen
*Assistant Examiner*—Julian A. Mercado
*Attorney, Agent, or Firm*—Evenson, McKeown, Edwards & Lenahan, P.L.L.C.

[57] ABSTRACT

A magnetron sputtering source and a method of use thereof on which the sputtering source has at least two toroidal magnetron electron taps each defining a maximum of a magnetic field strength component in a radial direction along a surface of the sputtering source. Thereby, from each one of a ring zone on a first smaller radius $R_{1F}$ and a second larger radius $R_{2F}$, a plane of the workpiece in a holder facing the sputtering source has a corresponding distance $d_1$ and $d_2$. A value d assumes all possible values of d1 and d2. In particular, $$0.8 \leq (R_{2F}-R_{1F})/d \leq 3.0$$

and preferably $$1.0 \leq (R_{2F}-R_{1F})/d \leq 2.2.$$

The arrangement defines a sputtering geometry with the process space essentially at very short target-to-substrate distance and with a defined dual concentric narrow plasma discharge with correspondingly defined concentrated plasma inclusion, whereby the substrate damage is reduced and high process economies are achieved.

34 Claims, 2 Drawing Sheets

MAGNETRON SPUTTERING SOURCE AND METHOD OF USE THEREOF

CROSS-REFERENCE TO RELATED PRIORITY APPLICATION

This application is based upon Swiss application No. 02820/95, filed Oct. 6, 1995, and incorporates the disclosure thereof herein.

BACKGROUND OF THE INVENTION

The present invention relates to an axially symmetrical magnetron sputtering source and to a method of using the source for coating optical storage disks such as DVDs or photo DCs, preferably CD-R or phase change disks.

Magnetron sputtering sources are described in general in DE-PS 40 18 914; DE-OS 24 31 832; EP-A 0 330 445; EP-A 0 311 697; and U.S. Pat. No. 5,164,063.

EP-A 94105388.6 describes a magnetron sputtering source that uses a focusing target body arrangement which greatly improves the ratio between the amount of material that has been sputtered off and that is actually deposited on the workpiece in the form of a film. This approach significantly enhanced economic production, principally by the sputtering surface of the target body essentially defining the process space. Thereby, aside from the actual workpiece, only very small surfaces that can adversely affect the material transfer factor from the target to the workpiece are exposed to the material vapor.

The foregoing advantage is principally achieved by giving the target a special, conical or concave mirror shape that is focused on the workpiece surface. The disadvantage of this known arrangement is, however, that not all targets of that special shape can be manufactured for all sputtering materials with equal ease and that the special magnetic fields required for achieving magnetron discharge cannot be realized with the necessary ease in order to achieve special process characteristics. For example, the focusing shape of the target would have to be elaborate for creating precious metal targets.

The special shape can also result in problems if precious metal targets require special alloys or grain structures for process-related reasons. Another point, as mentioned above, is the optimization of the magnetic field configuration, whether it is due to the sputtering characteristic or to process-related energy conditions which are necessary due to the sensitivity of certain substrates.

It is also known to provide several toroidal sputtering zones, for example two zones, in order to achieve highly uniform film thickness distribution on a planar substrate. For example, EP 0 095 211 shows such an arrangement in which two concentric plasma rings are generated on the surface of a planar target by magnetron magnetic fields. The usual optimization is for good target utilization and film thickness distribution and is achieved with wide adjacent erosion pits and a relatively large target-to-substrate distance. In conjunction with the proposed devices such as reflectors, the large target distance is necessary to prevent the emitted charge carrier such as electrons from reaching and damaging, or heating, the target. Due to the large target-to-substrate distance and the installed deflection devices, the material yield or material transfer factor is unfavorable.

Certain applications for optical storage disks require the economic deposition of high-quality precious metal films without damaging the storage disks. In particular, for rewritable compact disks called CD-R, thin gold films with very specific properties are required. Similar films are also used for digital video disks known as DVD, or for photo CDs. Another field of application is the coating of memory disks that function according to the phase change principle. The precious metal target should be easy to manufacture, easy to recycle, and be able to fulfill certain metallurgical requirements. Due to the costly materials, a high transfer factor or yield of the sputtered material is necessary. Not only must the coating achieve very high reflectivity but care must be taken that the deposition process does not, through radiation or particle bombardment, damage the sensitive organic workpiece coatings on which the precious metal film, preferably gold, is to be deposited. The principles and the requirements of such coatings are described, for example, in Magnetic and Optical Media Seminar (Nov. 3 to 4, 1994, Atlanta), and in the corresponding seminar paper "The CDR: Yesterday, Today and Tomorrow" by Tad Ishiguro.

The disadvantage of such a sputtering source is that it cannot completely fulfill the aforementioned requirements. In particular, a magnetron discharge cannot be configured by magnetic fields such that the damage to the organic dye coatings of the workpiece can be minimized without having to reduce the high transfer rate when a simple, economic target arrangement is used.

SUMMARY OF THE INVENTION

It is an object of the present invention to eliminate the aforementioned disadvantages, and, in particular, to provide a sputtering source that can deposit precious metal films, preferably gold films, on sensitive optical storage disks without damaging the organic base but through a highly economical process.

This object has been achieved with a magnetron sputtering source where the sputtering source has at least two toroidal magnetron electron taps each defining a maximum of a magnetic field strength component in a radial direction along a surface of the sputtering source such that, in one ring zone each on a first smaller radius $R_{1F}$ and a second larger radius $R_{2F}$, from which ring zones a plane of the workpiece in a holder facing the sputtering source has a corresponding distance $d_1$ and $d_2$, wherein a value d assumes all possible values of d1 and d2, and wherein $$0.8 \leq (R_{2F} - R_{1F})/d \leq 3.0$$

and preferably $$1.0 \leq (R_{2F} - R_{1F})/d \leq 2.2.$$

Because the arrangement according to the present invention defines the sputtering geometry with the process space essentially at very short target-to-substrate distance and with a defined dual concentric narrow plasma discharge with correspondingly defined concentrated plasma inclusion, the substrate damage is reduced and high process economies are achieved.

BRIEF DESCRIPTION OF THE DRAWINGS

These and other objects, features and advantages will become more apparent from the following detailed description of the preferred embodiments when taken in conjunction with the accompanying drawings wherein.

DETAILED DESCRIPTION OF THE DRAWINGS

Figure 1:
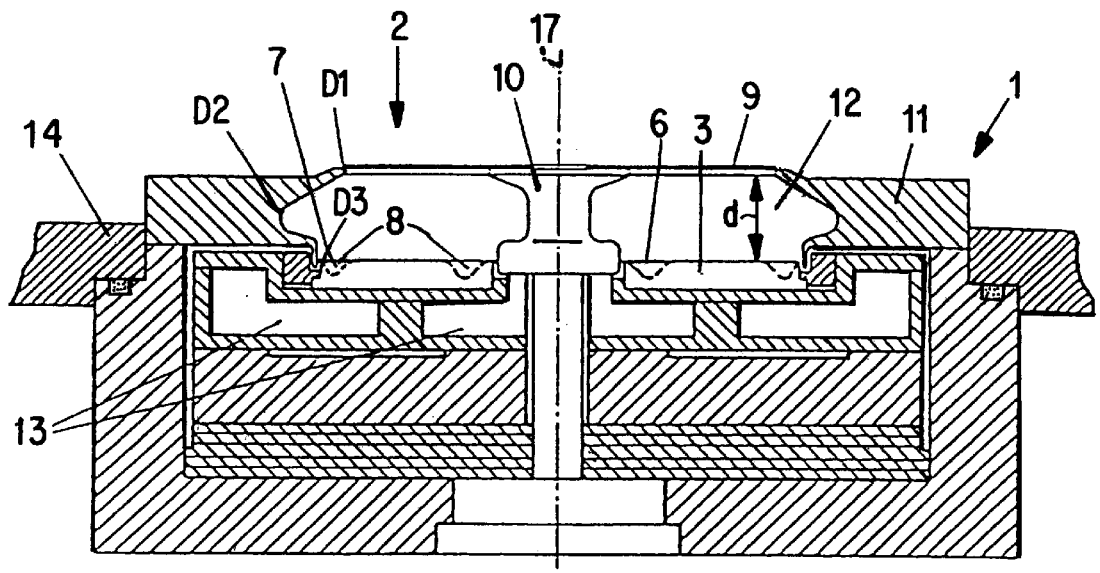
FIG. 1 is a schematic cross-sectional view of a magnetron sputtering source according to the present invention.

With the magnetic sputtering source arrangement in FIG. 1, it is possible to economically deposit precious metal films, preferably gold, without unacceptable damage to the sensitive workpieces throughout the useful area with a film thickness distribution of better than 5%. As above mentioned, the workpieces to be coated are optical storage disks which are easily damaged by radiation or particle bombardment and therefore impose particularly high demands on the coating quality. In this embodiment, the magnetron sputtering arrangement comprises a magnetron sputtering source 1 in which a storage disk 9 is arranged at distance d from the flat disc-shaped sputtering target 3 made of precious metal or its alloys. The side of the storage disk 9 to be coated faces the sputtering target 3 which is preferably made of gold. The back or rear of workpiece 9 faces the vacuum chamber 2 in which, for example, known devices for loading and unloading the workpieces are installed in addition to the vacuum generation equipment. Workpiece 9 is masked in the center of the magnetron sputtering source 1, for example, with a centrally arranged inside mask 10 and is also masked along its circumference workpiece 9 by the outer mask 11. The outer mask 11 encircles the disc-shaped workpiece or the resulting toroidal process space 12. Masks 10 or 11 can, of course, consist of multiple parts and thus also fulfill conventional electrode functions for plasma discharge.

On the back or rear of target 3 a magnet system space 13 is provided to contain the magnetic equipment for generating the required magnetic fields for generating magnetron ring discharges on the target surfaces. To prevent the need for elaborate designs the magnet systems are preferably stationary, and permanent magnets are preferably used. The magnetron sputtering arrangement 1 is flanged, for example, directly to an opening in vacuum chamber wall 14. The source could also be operated inside the vacuum chamber 2 in the conventional manner. As the workpieces are disk-shaped the entire source is arranged rotationally symmetric around a source axis 17.

When costly precious metal materials are used, a solution must be found for minimizing material losses. According to the present invention, the distance d between workpiece 9 and the sputtering source surface 6, 7 or the target surface must be kept as small as possible. However, this has been a problem because the normal spreading of the plasma can damage the workpiece 9 and because a distribution variation of <5% must be met. According to the present invention, however, a correspondingly small distance d can be used and two plasma discharge rings produced that have a relatively small extent or spread and thus create the effect of two small concentrically arranged sputtering source surfaces or ring zones. Through the ion bombardment of the target to be sputtered, the plasma rings cause the target to be eroded and corresponding sputtering source surfaces 6, 7 to be formed.

The toroidal inner sputtering source surface 6 is located relatively close to the central area 17, whereas the outer toroidal sputtering surface 7 is located at a similar or somewhat larger distance from the source axis than the outer edge of workpiece 9. In accordance with the invention a zone is created between sputtering surfaces 6, 7 which preferably and essentially does not sputter. This zone is preferably as wide as the smaller width of the toroidal sputtering source surfaces 6, 7. The plasma discharges are operated in the conventional manner with a working gas such as argon within the pressure range of $1 \cdot 10^{-1}$ mbar to $1 \cdot 10^{-3}$ mbar and preferably within the range of $1 \cdot 10^{-1}$ mbar to $1 \cdot 10^{-2}$ mbar. Of course, if necessary, reactive gases can be used.

In the known arrangements it is not conventional to use such short distances due to the problems with the high workpiece stress. In addition, it is not conventional to produce two narrow toroidal, concentric erosion tracks that are relatively far apart because this results in poor target utilization. In the application according to the present invention, however, the objects are to minimize material transfer losses from the target to the substrate and to find a solution that allows the deposition of a film with the desired properties. A target utilization which itself is not very high is not of major consequence because this material is easy to recycle unlike the material deposited on the mask parts or other internal fittings.

The present invention solves the problem described above with the recognition of how the distance d between the target surface and the substrate is sized, and the position and the width of the two sputtering source surfaces are properly selected. For the distance d, a range of no more than about 15 mm to 30 mm is required where the distance should more preferably be within the range of 20 mm to 25 mm. The inner sputtering source surface 6 or the ring zone has a mean radius of $R_{1E}$ from source axis 17, whereas the outer ring has a mean radius $R_{2E}$. According to the present invention, these radii of the sputtering source surfaces should satisfy the condition $0.8 \leq (R_{2E} - R_{1E})/d \leq 3.0$ but preferably $1.0 \leq (R_{2E} - R_{1E})/d \leq 2.2$ in order to fulfill the requirements.

Figure 4:
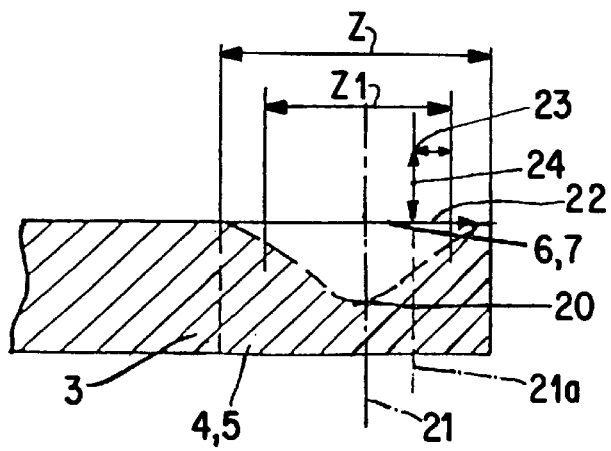
FIG. 4 is an enlarged schematic cross-sectional view of a target or a target ring with erosion zones as well as a schematic representation of the location of magnetic field components.

Also according to this invention, the characteristic magnetic field conditions for the magnetron electron traps are responsible for positioning the ring sources. Each electron trap must have, on the sputter source surface or the target surface 6, 7, a maximum radial component parallel to the main surface direction which is defined in its absolute magnitude as well as in the position relative to source axis 17. The position condition for this maximum magnetic field component essentially corresponds to the aforementioned conditions for the sputtering source surface. The exact central position of the sputtering source surface 6, 7 deviates by the intersection of the ring zone center axis 21 with the sputtering source surface 6, 7 deviates slightly, however, from the location of the maximum position of the parallel field vector 22 (FIG. 4). The maximum value of field vector 22 is slightly offset outward by approx. 3 mm to 5 mm relative to the center of the outer sputtering source surface 7 and is located on the ring with radius $R_{2F}$, whereas the maximum parallel field vector 22 of the inner sputtering source zone is also slightly offset in the direction of source axis 17 relative to the center of the inner sputtering source surface, preferably by approx. 3 mm to 5 mm, which vector is located on the ring with radius $R_{1F}$.

For workpiece disc diameters $D_1$ of 120 mm or 130 mm, for example, which are preferably used for optical storage disks, the inner radius $R_1$ is preferably 20 mm to 30 mm and most preferably 24 mm to 28 mm. For the radius $R_2$, a range of 55 mm to 65 mm should preferably be selected.

In addition it has been found advantageous to select the outer diameter $D_3$ for target 3, 5 with its sputtering source surface 7 that reaches to the edge, somewhat larger than diameter $D_1$ of workpiece 9 or workpiece holder 11. Diameter $D_1$, should be a maximum of 20% smaller than diameter $D_3$, but preferably a maximum of 10% smaller.

In order to achieve favorable spreading conditions for the plasma and the sputtered material, diameter $D_2$ of the plasma discharge space or the torus space 12 is preferably selected larger than the outer diameter $D_3$ of target 3, 5 where this diameter is preferably at least 50% larger than distance d.

The magnetic field arrangement 13 for the magnetron electron traps must be dimensioned such that the required small erosion zones 8 or sputtering source surfaces 6, 7 are created. On each ring zone 6, 7 on sputtering source surface 6, 7 or the target surface of targets 3, 4, 5 in the center of the assigned ring zone essentially located on $R_1$ or $R_2$, a magnetic field strength component 22 occurs parallel to the new target surface as seen in FIG. 4. This component reaches the maximum value at the intersection with the surface and its ring zone axis 21a or on the radii $R_{1F}$ and $R_{2F}$. This value should preferably reach at least 200 Gauss and even more preferably at least 350 Gauss. The inner ring zone $R_{1F}$ should preferably have a value of at least 400 Gauss. The spreading and the nature of the plasma discharge is further defined by the pattern of the incoming and outgoing field lines of the magnetron electron trap above sputtering source surface 6, 7. At a distance of 10 mm from sputtering source surface 6, 7 along axis 21a, the parallel component 23 of the magnetic field strength should preferably not exceed 60% of the maximum component 22 on the sputtering source surface and even more preferably not exceed 55% of this component 22. On the ring zone with the smaller radius $R_{1F}$, this second component 23 should preferably be larger than on the ring zone with the larger radius $R_{2F}$.

The ring zone width of the sputtering source surfaces from which currently 70% of the sputtered material allocated to the ring zone originates, should be 16 mm wide maximum, but preferably 12 mm wide maximum and even more preferably less than 10 mm wide.

Figure 2:
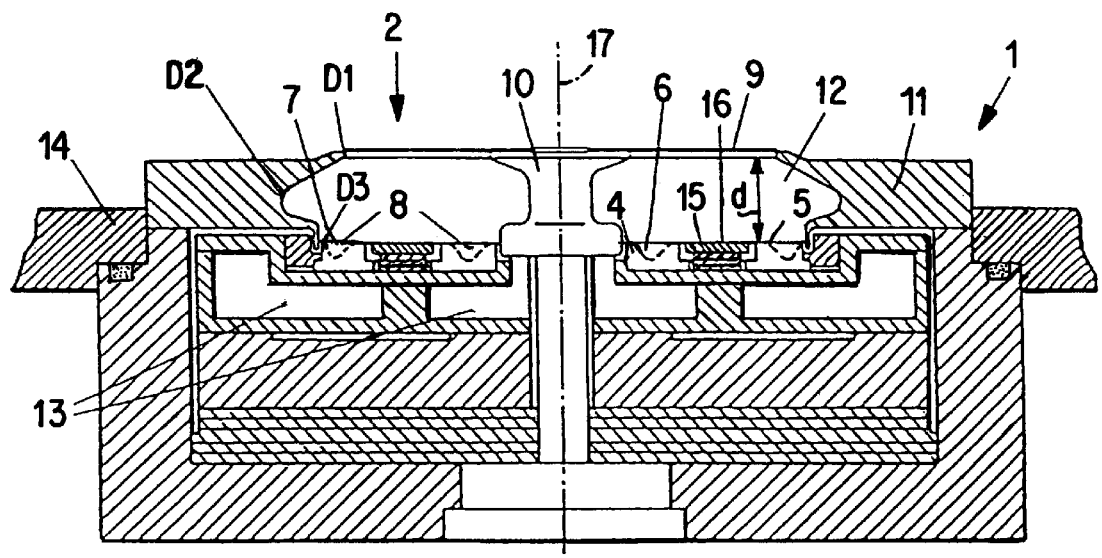
FIG. 2 is another schematic cross-sectional view of a presently preferred magnetron sputtering arrangement according to the present invention.

FIG. 2 illustrates another preferred embodiment of the design according to the present invention. The subdivision of target 3 into two ring targets 4, 5 which essentially accommodate only the erosion profiles offers additional advantages with respect to handling economy of the costly precious metals, and additional advantages with respect to better cooling possibilities and better control of the erosion profile through the improved configurability of the magnetic field generators and the electrode arrangement. Good target cooling results in better control of the crystal structure of the precious metal, in particular with respect to the sensitive gold. The ability to install additional parts with electrodes 16 or magnetic materials between target rings 4, 5 allows further optimization of the erosion profile 8. This results in better target utilization or allows the emission profile of the sputtered material to be positively influenced in order to further improve the economy of the arrangement.

Between the inner ring target 4 with the inner sputtering source or ring zone 6 and the outer ring target 5 with the outer sputtering source surface or ring zone 7, an insulated electrode 16 is preferably arranged via an insulator 15. The electrode 16 can either be connected to an electrical potential or be operated with floating potential. On one side, this prevents material sputtering in the area between the two target rings 4, 5 and on the other side the discharge conditions with respect to charge carrier bombardment can be influenced through the application of supplementary potentials. In all target arrangements, care must be taken in the conventional manner that no unwanted material is sputtered from the edge zone of the targets. This can be achieved in the conventional manner by maintaining dark space distances to the counter electrodes 10, 11.

Figure 3A:
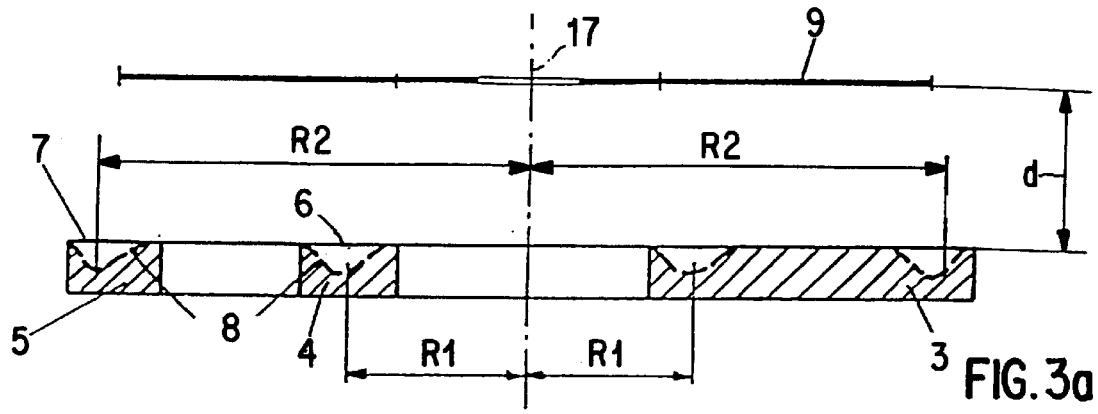
FIG. 3a is a schematic view of the geometric target arrangement relative to the workpiece.

FIG. 3 illustrates different embodiments of arranging the sputtering source surface 6, 7 or targets 3, 4, 5 opposite the disc-shaped workpiece 9. FIG. 3a shows on the right-hand side of the source axis 17 that a flat target with distance d from workpiece 9 can be arranged where the inner sputtering source surface 6 has a mean radius $R_1$, and the outer sputtering source surface 7 a mean radius $R_2$. The expected erosion profiles 8 are shown with dashed lines. On the left-hand side of source axis 17 the original flat target 3 is subdivided into two ring targets 4, 5 arranged concentrically in the same plane. This arrangement is a preferred version because it is particularly favorable and economical to operate.

Figure 3B:
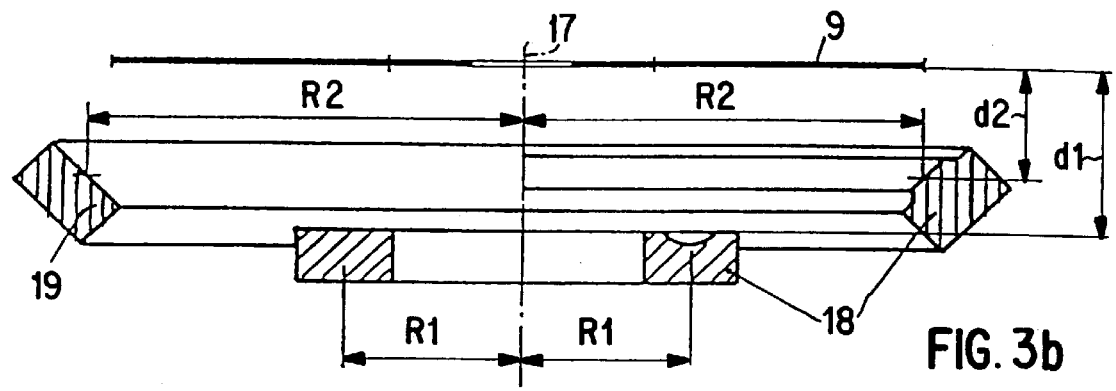
FIG. 3b is another view similar to FIG. 3a with different and inclined target rings.

As illustrated in FIG. 3b on the right-hand side of the source axis, the target 18 can, of course, have a specific profile, for example convex or concave in order to achieve specific emission characteristics or advantageous characteristics with respect to target utilization. FIG. 3b also shows that toroidal targets with their sputtering source surfaces may also have a certain inclination 19 relative to the source axis or the workpiece 9. This is another way of influencing the emission characteristic of the sputtered material and consequently of influencing the film distribution on the workpiece 9. An inclination can be set on the inner ring as well as the outer ring, with and inward or outward slant.

Figure 3C:
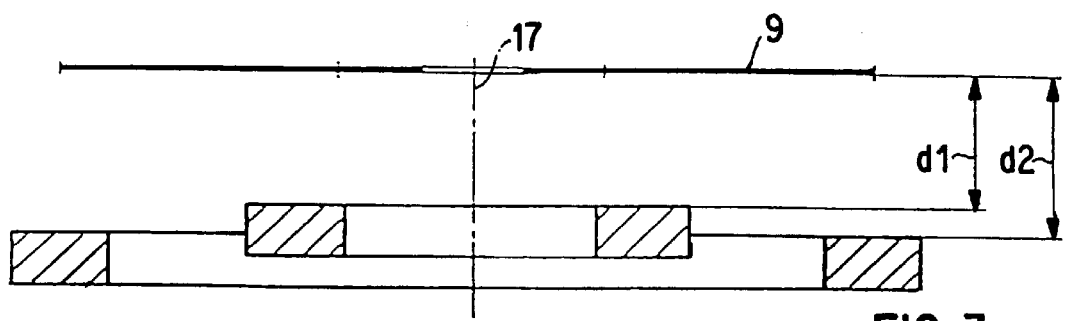
FIG. 3c is still another view similar to FIGS. 3a and 3b with target rings which have a different distance to the workpiece.

FIG. 3c also shows schematically how the inner ring or outer ring can have different distances $d_1$ or $d_2$ relative to workpiece 9. However, the ranges of $d_1$ and $d_2$ should be within the aforementioned range of d.

FIG. 4 is a cross-section of a sputtering source surface 6, 7 or an erosion pit 8 which can be formed in target 3, 4, 5. In magnetron discharge arrangements, the erosion pit normally has an erosion maximum 20 in the center of the sputtering source surface. In this case this maximum is located on ring zones $R_1$ and $R_2$. The ring zone axis 21 passes through the erosion maximum 20 and intersects the sputtering source surface 6, 7 at a right angle. The sputtering source surface 6, 7 which is that surface that is sputtered off by ion bombardment, has an edge-to-edge width Z. More material is sputtered off toward the center where width $Z_1$ spans that surface from which 70% of the material from the erosion pit originates. As mentioned above, the ring zone axis 21 generally does not coincide exactly with the axis which at the intersection with the sputtering source surface 6, 7 defines the location of the maximum magnetic field component 22 running parallel to the sputtering source surface. In FIG. 4, this axis is labeled 21a. The second defined field component 23 running parallel to the sputtering source surface is specified with a distance 24 from the sputtering source surface of 10 mm. The previously specified values of the maximum magnetic field components at the two points shows that in contrast to the known arrangement the magnetic field of the typical magnetron electron trap has a strong inhomogeneity within a narrow space and consequently has an unusually strongly declining field gradient in the outward direction.

Exemplary Configuration

A specific embodiment in accordance with the present invention has the following characteristics

- Workpiece diameter 120 mm
- Distance d 26 mm
- Torus space diameter $D_2$ 140 mm
- Outer target edge diameter $D_3$ (flat target) 130 mm
- Radius $R_1$ 26 mm
- Radius $R_2$ 63 mm
- Width of the inner sputtering source surface $Z_1$ 10 mm
- Width of the outer sputtering source surface $Z_1$ 7 mm
- Target material gold
- Working gas argon
- Working pressure in the discharge chamber $5 \times 10^{-2}$ mbar
- Parallel maximum magnetic field component 22 on the outer sputtering source surface 350 Gauss at a distance of 10 mm 150 Gauss
- Parallel maximum magnetic field component of the inner sputtering source surface 470 mm at a distance of 10 mm 250 Gauss
- Sputtering power 3 kW
- Discharge voltage 500 to 700 VDC
- Sputtering rate 50 nms
- Film thickness distribution from radius 20 to radius 60 of the workpiece better than 5%.
- Material transfer factor better than 30% to 40%

The results achieved were highly positive without damage to the sensitive dye coating on the optical disk, and this with an unusually high transfer factor. The usual transfer factors in static coating systems at the necessarily high distribution requirements are in the range of less than 30%, typically 15% to 20%, particularly with such small workpiece diameters.

The arrangement according to the present invention can, of course, also be used for smaller or larger workpiece diameters than specified above, for example, diameters of 50 mm to 70 mm.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A magnetron sputtering arrangement, comprising
   an axially symmetrical magnetron sputtering source;
   a holder for positioning a disc-shaped workpiece, coaxially to an axis of symmetry of the sputtering source and at a corresponding distance therefrom;
   wherein the sputtering source has at least two toroidal magnetron electron traps each defining a maximum of a magnetic field strength component in a radial direction along a surface of the sputtering source such that, said respective maxima are disposed in inner and outer ring zones defining an inner radius $R_{1F}$ and an outer radius $R_{2F}$ from which ring zones a plane of the workpiece in the holder facing the sputtering source has a corresponding distance $d_1$ and $d_2$ wherein a value d assumes values of $d_1$ and $d_2$, and wherein:

$$0.8 \leq (R_{2F} - R_{1F})/d \leq 3.0.$$

2. The arrangement according to claim 1, wherein said maximum component measured at a distance of from the sputtering source surface is 60% maximum of said component on the sputtering source surface.

3. The arrangement according to claim 2, wherein said component at said distance is at most 55% of said component down on said sputtering surface.

4. The arrangement according to claim 2, wherein said component at said distance is larger at said zone with said inner radius than at said zone with said outer radius.

5. The arrangement according to claim 1, wherein a maximum magnetic field strength component on the sputtering source surface is at least 200 Gauss, and on the inner ring zone is at least 400 Gauss.

6. The arrangement according to claim 1, wherein the ring zones are substantially in a common plane.

7. The arrangement according to claim 1, wherein the ring zones are each located in a separate concentric target material ring.

8. The arrangement according to claim 7, wherein a radial width of said target material rings substantially correspond to the width of respective ring zones defined as 70% of the material momentarily sputtered at one ring zone origin measures 16 mm maximum.

9. The arrangement according to claim 8, wherein the radial width is at most 12 mm.

10. The arrangement according to claim 8, wherein the radial width is at most 10 mm.

11. The arrangement according to claim 1, wherein:

$R_{1F}$ approximately equals $R_{1E}$=a first workpiece radius $R_1$;

$R_{2F}$ approximately equals $R_{2E}$=a second workpiece radius $R_2$;

$20 \text{ mm} \leq R_1 \leq 30 \text{ mm}$, and $55 \text{ mm} \leq R_2 \leq 68 \text{ mm}$.

12. The arrangement according to claim 11, wherein $R_1$ is $24 \text{ mm} \leq R_1 \leq 28 \text{ mm}$.

13. The arrangement according to claim 11, wherein $55 \text{ mm} \leq R_2 \leq 68 \text{ mm}$.

14. The arrangement according to claim 1, wherein:

$15 \text{ mm} \leq d \leq 30 \text{ mm}$.

15. The arrangement according to claim 1, wherein the holder is configured to accommodate a disc-shaped workpiece having a diameter $D_1$ which is smaller than an outer diameter $D_3$ of the sputtering source surface by at most 20%.

16. The arrangement according to claim 15, wherein the workpiece has a diameter $D_1$ which is at most 10% smaller than the outer diameter $D_3$.

17. The arrangement according to claim 1, wherein the sputtering surface is a precious metal.

18. The arrangement according to claim 1, wherein a surface between the ring zones is configured as a non-sputtering electrode and is operated on one of a predetermined electrical potential and floating potential.

19. The arrangement according to claim 1, wherein a disc-shaped workpiece arranged on the holder and the sputtering surface define upper and lower boundaries of a toroidal processing space.

20. The arrangement according to claim 19, wherein a maximum diameter of the toroidal processing space is greater than an outer diameter of the sputtering source surface.

21. The arrangement according to claim 1, wherein $$1.0 \leq (R_{2F}-R_{1F})/d \leq 2.2.$$

22. The arrangement according to claim 1, wherein the maximum magnetic field strength component is 350 Gauss.

23. The arrangement according to claim 1, wherein the sputtering surface is gold.

24. A magnetron sputtering arrangement, comprising:
an axially symmetrical magnetron sputtering source;
a holder for positioning a disc-shaped workpiece coaxially to an axis of symmetry of the sputtering source and at a corresponding distance therefrom,
wherein the sputtering source forms at least two toroidal erosion pits each defining an erosion maximum along a surface the sputtering source, such that in one ring zone each along the sputtering source surface on a first smaller radius $R_{1E}$ and a second larger radius $R_{2E}$, from which ring zones a plane of the workpiece in the holder facing the source has a distance $d_1$ and $d_2$, wherein a value d assumes values of $d_1$ and $d_2$, and wherein:

$$0.8 \leq (R_{2E}-R_{1E})/d \leq 3.0.$$

25. A magnetron sputtering arrangement according to claim 24, and further wherein the sputtering source has at least two toroidal magnetron electron taps each defining a maximum of a magnetic field strength component in a radial direction along a surface of the sputtering source such that, in one ring zone each on a first smaller radius $R_{1F}$ and a second larger radius $R_{2F}$, from which ring zones a plane of the workpiece in the holder facing the sputtering source has a corresponding distance $d_1$ and $d_2$ wherein a value d assumes values of d1 and d2, and wherein:

$$0.8 \leq (R_{2F}-R_{1F})/d \leq 3.0.$$

26. The arrangement according to claim 17, wherein $$1.0 \leq (R_{2F}-R_{1F})/d \leq 2.2.$$

27. The arrangement according to claim 24, wherein a ring zone width defined as 70% of the material momentarily sputtered at one of the ring zone origins measures 16 mm maximum.

28. The arrangement according to claim 27, wherein the ring zone width is at most 12 mm.

29. The arrangement according to claim 27, wherein the ring zone width is at most 10 mm.

30. The arrangement according to claim 24, wherein $$1.0 \leq (R_{2E}-R_{1E})/d \leq 2.2.$$

31. An arrangement for producing a sputter-coated disc-shaped workpiece, comprising:
an axially symmetrical magnetron sputtering source;
a holder for positioning a disc-shaped workpiece, coaxially to an axis of symmetry of the sputtering source and at a corresponding distance therefrom;
wherein the sputtering source has at least two toroidal magnetron electron traps each defining a maximum of a magnetic field strength component in a radial direction along a surface of the sputtering source such that, in one ring zone each on a first smaller radius $R_{1F}$ and a second larger radius $R_{2F}$, from which ring zones a plane of the workpiece in the holder facing the sputtering source has a corresponding distance $d_1$ and $d_2$ wherein a value d assumes values of d1 and d2, and wherein:

$$1.0 \leq (R_{2F}-R_{1F})/d \leq 2.2.$$

32. An arrangement for producing coated optical storage disks, comprising:
DVDs, photo CDs, CD-R and phase change disks;
an axially symmetrical magnetron sputtering source;
a holder for positioning a disc-shaped workpiece coaxially to an axis of symmetry of the sputtering source and at a corresponding distance therefrom,
wherein the sputtering source forms at least two toroidal erosion pits each defining an erosion maximum along a surface the sputtering source such that, in one ring zone each along the sputtering source surface on a first smaller radius $R_{1E}$ and a second larger radius $R_{2E}$, from which ring zones a plane of the workpiece in the holder facing the source has a distance $d_1$ and $d_2$, wherein a value d assumes values of $d_1$ and $d_2$, and wherein:

$$1.0 \leq (R_{2E}-R_{1E})/d \leq 2.2.$$

33. Method for producing a sputter-coated disc-shaped workpiece comprising the steps of:
providing an axially symmetrical magnetron sputtering source having at least two toroidal magnetron electron traps each defining a maximum of a magnetic field strength component in a radial direction along a surface of the sputtering source such that, in one ring zone each on a first smaller radius $R_{1F}$ and a second larger radius $R_{2F}$, from which ring zones a plane of the disc-shaped workpiece in the holder facing the sputtering source has a corresponding distance $d_1$ and $d_2$ wherein a value d assumes values of d1 and d2, and wherein:

$$1.0 \leq (R_{2F}-R_{1F})/d \leq 2.2;$$

and
using a holder for positioning the disc-shaped workpiece, coaxially to an axis of symmetry of the sputtering source and at a corresponding distance therefrom.

34. Method of producing coated optical storage disks including DVDs, photo CDs, CD-R and phase change disks; comprising the steps of:
providing an axially symmetrical magnetron sputtering source having at least two toroidal erosion pits, each defining an erosion maximum along a surface of the sputtering source such that, in one ring zone each along the sputtering source surface on a first smaller radius $R_{1E}$ and a second larger radius $R_{2E}$, from which ring zones a plane of the workpiece in the holder facing the source has a distance $d_1$ and $d_2$, wherein a value d assumes values of $d_1$ and $d_2$, and wherein:

$$1.0 \leq (R_{2E}-R_{1E})/d \leq 2.2;$$

and
using a holder for positioning the disc-shaped workpiece coaxially to an axis of symmetry of the sputtering source and at a corresponding distance therefrom.

* * * * *

UNITED STATES PATENT AND TRADEMARK OFFICE
CERTIFICATE OF CORRECTION

PATENT NO. : 5,997,697
DATED : December 7, 1999
INVENTOR(S) : Pius GRUENENFELDER et al.

It is certified that error appears in the above-indentified patent and that said Letters Patent is hereby corrected as shown below:

On Title page insert the following:

--[30]  Foreign Application Priority Data
  Oct. 6, 1995  [CH]  Switzerland ................ 2820/95--

Signed and Sealed this

Seventh Day of November, 2000

Attest:

Q. TODD DICKINSON

*Attesting Officer*  *Director of Patents and Trademarks*